United States Patent
Shan et al.

(10) Patent No.: US 7,760,498 B2
(45) Date of Patent: Jul. 20, 2010

(54) ELECTRONIC APPARATUS WITH AIR GUIDING ELEMENT

(75) Inventors: Liang-Qing Shan, Shenzhen (CN); Yang Li, Shenzhen (CN); Yu-Hsu Lin, San Jose, CA (US); Jeng-Da Wu, Taipei Hsien (TW); Liang-Liang Cao, Shenzhen (CN); Lei Guo, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 45 days.

(21) Appl. No.: 12/137,781

(22) Filed: Jun. 12, 2008

(65) Prior Publication Data

US 2009/0190309 A1 Jul. 30, 2009

(51) Int. Cl.
*H05K 7/20* (2006.01)
(52) U.S. Cl. .............. 361/695; 361/697; 165/80.3; 454/184
(58) Field of Classification Search ........... 361/695, 361/697, 679.54, 703, 692, 694, 679.48, 361/679.49, 704
See application file for complete search history.

(56) References Cited

U.S. PATENT DOCUMENTS

| | | | | |
|---|---|---|---|---|
| 3,592,260 A * | 7/1971 | Berger | ................. | 165/121 |
| 5,873,407 A * | 2/1999 | Wang et al. | ................. | 165/80.3 |
| 6,504,718 B2 * | 1/2003 | Wu | ................. | 361/695 |
| 7,120,018 B2 * | 10/2006 | Shen et al. | ................. | 361/695 |
| 7,209,352 B2 * | 4/2007 | Chen | ................. | 361/695 |
| 7,345,873 B2 * | 3/2008 | Dey et al. | ................. | 361/695 |
| 7,359,193 B2 * | 4/2008 | Deguchi | ................. | 361/695 |
| 7,551,437 B2 * | 6/2009 | Itoh | ................. | 361/697 |
| 2007/0235168 A1* | 10/2007 | Chen et al. | ................. | 165/124 |
| 2008/0041562 A1* | 2/2008 | Bhatia | ................. | 165/80.3 |

* cited by examiner

*Primary Examiner*—Jayprakash N Gandhi
*Assistant Examiner*—Courtney Smith
(74) *Attorney, Agent, or Firm*—D. Austin Bonderer

(57) ABSTRACT

An electronic apparatus includes an enclosure (30), a circuit board (40), a fan module (20), and an air guiding element (10) mounted in the enclosure. The circuit board includes at least one heat generating component (41) thereon. The fan module has a fan (22) and an output opening (213) corresponding to the fan. The air guiding element comprises a resisting panel (11) and a guiding panel (12) comprises a free end that extends toward the output opening of the fan module. The at least one heat generating component and the output opening are on the same side of the resisting panel. The guiding panel defines a free end (127) and a connecting end (125) connecting the resisting panel. A plane defined by the ends of the guiding panel is aligned at an angle larger than 90 degrees relative to the resisting panel.

16 Claims, 4 Drawing Sheets

ELECTRONIC APPARATUS WITH AIR GUIDING ELEMENT

BACKGROUND

1. Technical Field

The present invention relates to an electronic apparatus, and more particularly to an electronic apparatus with an air guiding element.

2. General Background

A common electronic apparatus has a plurality of connectors for connecting devices, such as computers. The electronic apparatus has a pair of fan modules at opposite ends thereof, respectively. Each fan module includes a fan disposed on one end thereof for dissipating heat generated by the connectors near the opposite end of the fan module. However, when one of the pair of fan modules is out of order, airflow may cease, allowing connectors to overheat.

What is needed, therefore, is an electronic apparatus dissipates heat efficiently.

SUMMARY

An electronic apparatus, includes an enclosure, a circuit board, a fan module, and an air guiding element mounted in the enclosure. The circuit board includes at least one heat generating component thereon. The fan module has a fan and an output opening corresponding to the fan. The air guiding element comprises a resisting panel and a guiding panel comprises a free end that extends toward the output opening of the fan module. The at least one heat generating component and the output opening are on the same side of the resisting panel. The guiding panel defines a free end and a connecting end connected to the resisting panel. A plane defined by the ends of the guiding panel is aligned at an angle larger than 90 degrees relative to the resisting panel.

Other advantages and novel features will be drawn from the following detailed description of embodiments with attached drawings, in which:

DETAILED DESCRIPTION

Figure 1:
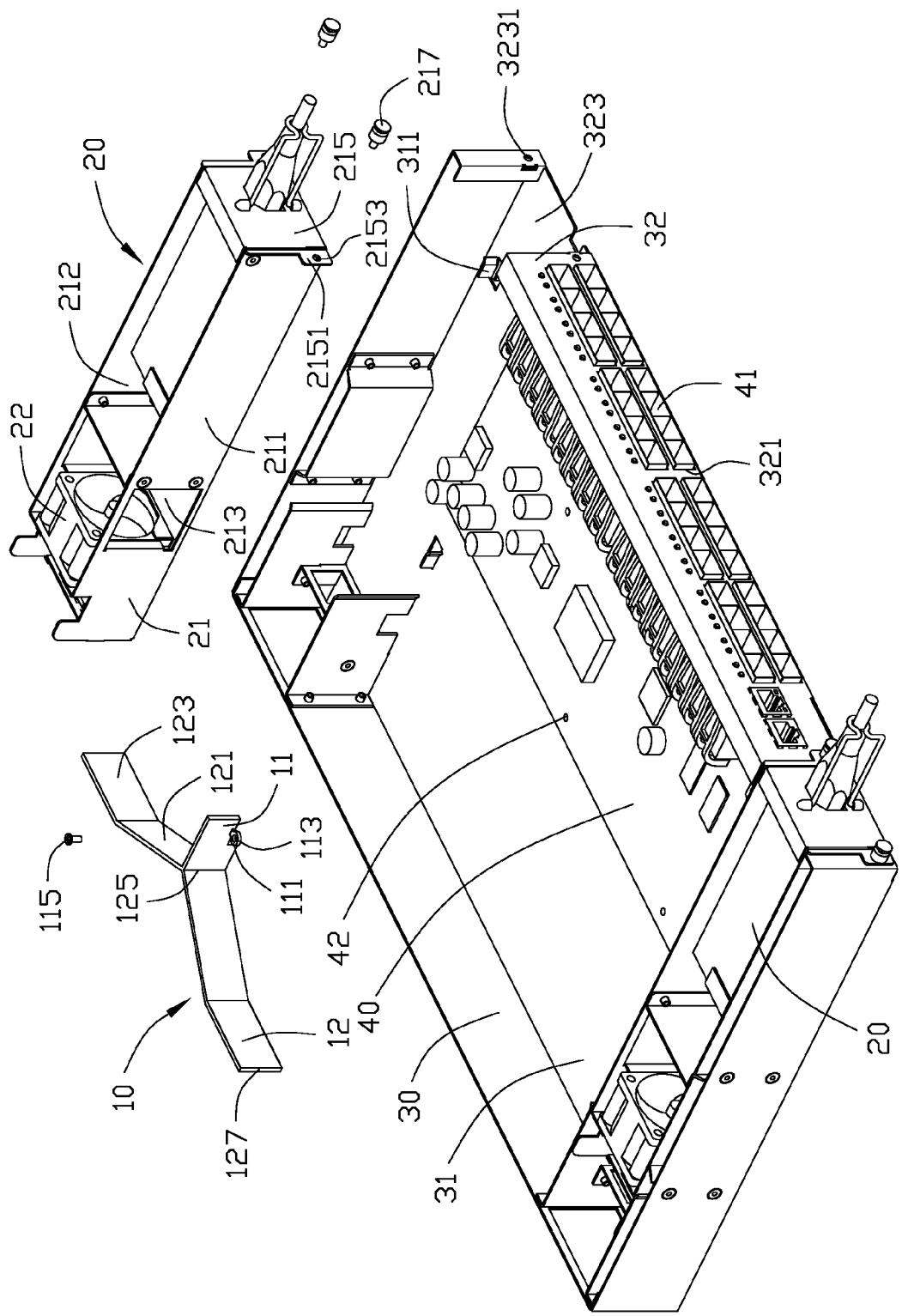
FIG. 1 is a schematic, exploded view of an electronic apparatus including an air guiding element of a first embodiment of the present invention.

Referring to FIG. 1, an electronic apparatus of a first embodiment of the present invention, includes an enclosure 30, a circuit board 40 secured in the enclosure 30, an air guiding element 10, and a pair of fan modules 20 secured in the enclosure 30.

Each fan module 20 includes a bracket 21 and a fan 22 mounted on a rear side of the bracket 21. The bracket 21 includes two side plates 211, 212, and a front plate 215. The side plate 211 defines an output opening 213 therein near the fan 23. A securing tab 2151 extends from the front plate 215 at each of two opposite edges thereof. Each securing tab 2151 defines a screw hole 2153 therein.

The air guiding element 10 includes a resisting panel 11 and two guiding panels 12 symmetrically extending from the resisting panel 11 toward the output openings 213 of the fan modules 20 respectively. A securing tab 111 extends from one side of the resisting panel 11, which defines a securing hole 113. The resisting panel 11 defines a cutout therein for resting on the circuit board 40. Each guiding panel 12 includes a first bending portion 121 extending from the resisting panel 11, and a second bending portion 123 extending from the first bending portion 121. The guiding panel 12 has a connecting end 125 connected to the resisting panel 11, and a free end 127. A plane defined by the free end 127 and the connecting end 125 is aligned at an angle larger than 90 degrees relative to the resisting panel 11.

A plurality of heat generating components is disposed on a front end of the circuit board 40. In this embodiment, the heat generating components are connectors 41. The circuit board 40 defines a screw hole 42 corresponding to the securing hole 113 of the air guiding element 10.

The enclosure 30 includes a bottom wall 31 for receiving the circuit board 40 thereon, and a front wall 32 perpendicular to the bottom wall 31. Two pairs of positioning clips 311 respectively protrude from two opposite ends of the bottom wall 31. The pairs of positioning clips 311 are aligned so as to position and respectively retain the fan modules 20 therebetween. The front wall defines a plurality of holes 321 respectively corresponding to the connectors 41 of the circuit board 40. A pair of openings 323 is respectively defined in two opposite ends of the front wall 32 for receiving the fan modules 20 therein. Each opening 323 defines a screw hole 3231.

Figure 2:
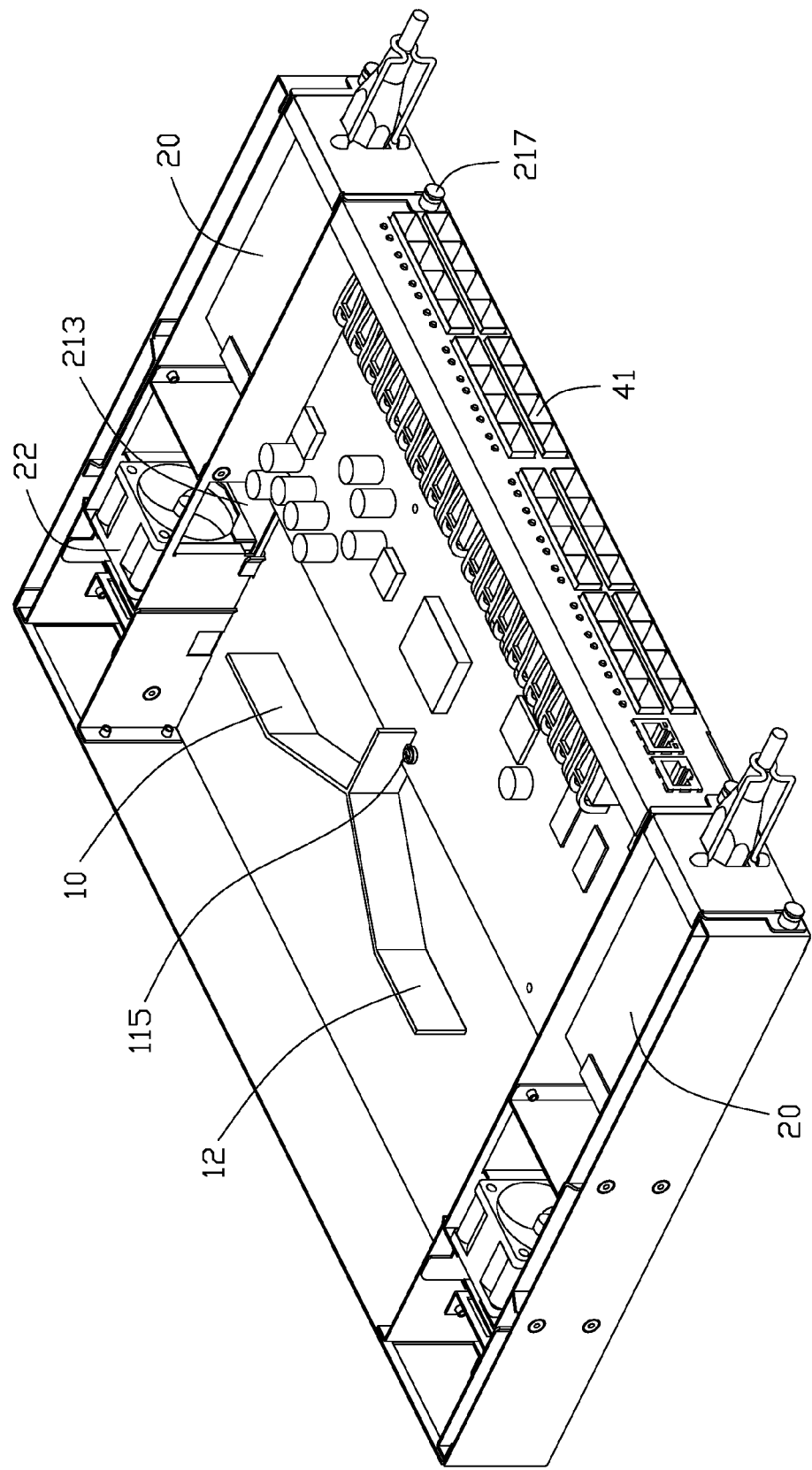
FIG. 2 is an assembled view of FIG. 1.

Referring to FIGS. 1 and 2, two fan modules 20 are respectively pushed rearwards corresponding to the openings 323 of the enclosure 30, until the front plates 215 of the two fan module 20 abut on outside of the front wall 32 of the enclosure 30. At this position, side plates 211, 212 of the fan module 20 are sandwiched between a corresponding pair of positioning clips 311, and the screw holes 2153 of the securing tab 2151 respectively align with the screw holes 3231 of the front wall 32 of the enclosure 30. Two screws 217 are respectively screwed through the screw holes 2153, 3231 to secure the fan modules 20 in the enclosure 30. The securing hole 113 of the air guiding element 10 aligns with the screw hole 42. A screw 115 is screwed into the securing hole 113 and the screw hole 42 to secure the air guiding element 10 on the circuit board 40. The guiding panels 12 of the air guiding element 10 extend towards the output openings 213 respectively, and the resisting panel 11 of the air guiding element 10 is disposed near the connectors 41 of the circuit board 40. The resisting panel 11 of the air guiding element 10 is disposed between the output opening 213 and the connectors 41 of the circuit board 40.

When one fan module 20 is on, air partly flows to the connectors 41 disposed on a diagonal portion relative to the opening 213, and partly flows to the connectors 41 near the front end of the one fan module 20 due to the guiding effect of the air guiding element 10. Therefore, if one fan module 20 is out of order, the other fan module 20 can also dissipate heat for all the connectors 41 of the circuit board 40.

Figure 3:
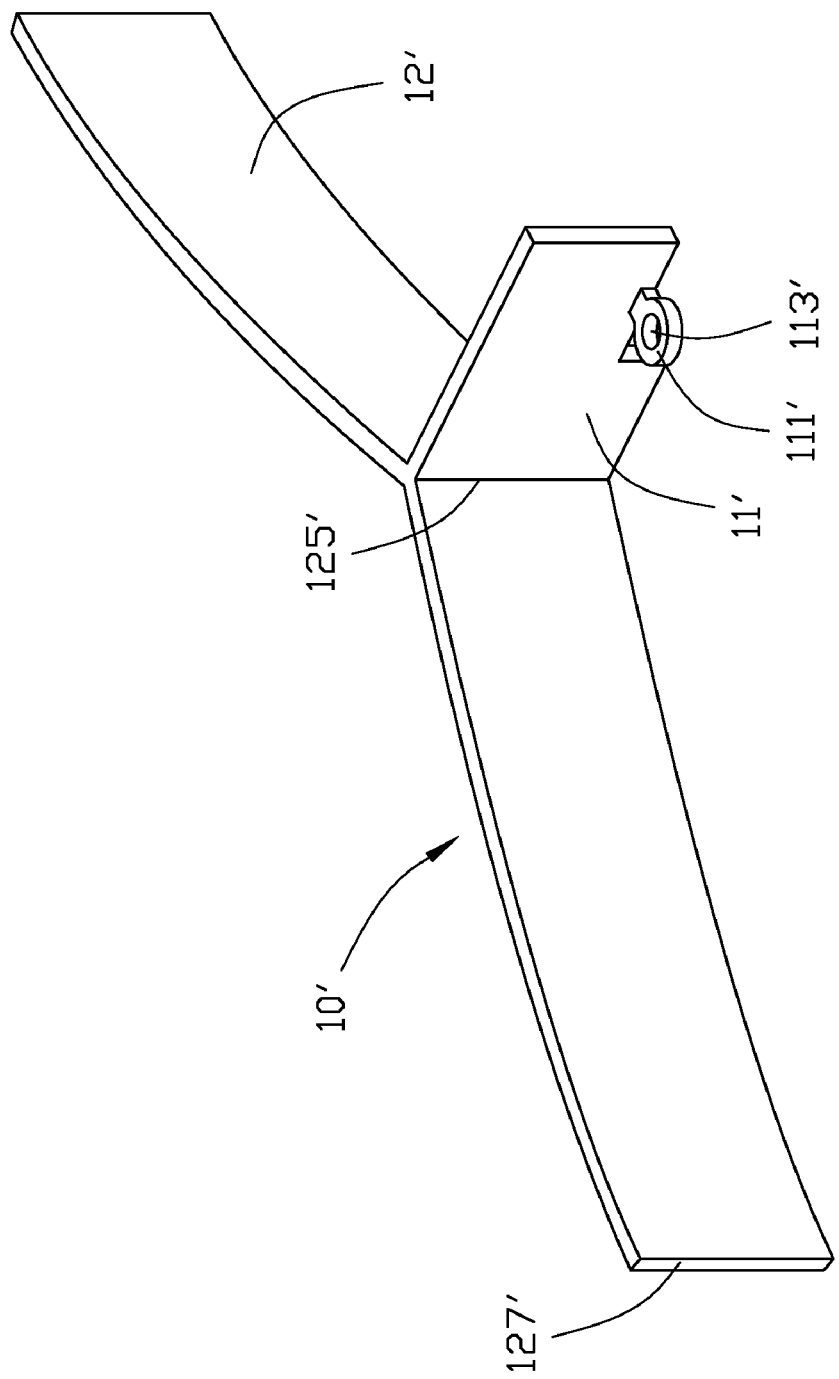
FIG. 3 is a schematic view of an air guiding element of an electronic apparatus of a second embodiment of the present invention.

Referring to FIG. 3, an air guiding element 10' of an electronic apparatus of a second embodiment of the present invention, includes a resisting panel 11' and two guiding panels 12' extending from the resisting panel 11' symmetrically and respectively towards the output openings 213 of the fan modules 20. Each guiding panel 12' is arc-shaped. A securing tab 111' extends from one side of the resisting panel 11' which defines a securing hole 113'. The resisting panel 11' defines a cutout therein for matching with the circuit board 40. The guiding panel 12' defines a connecting end 125' connecting the resisting panel 11' and a free end 127'. A plane defined by a free end 127' of the second bending portion 123' and the connecting end 125' is aligned at an angle larger than 90 degrees relative to the resisting panel 11'.

Figure 4:
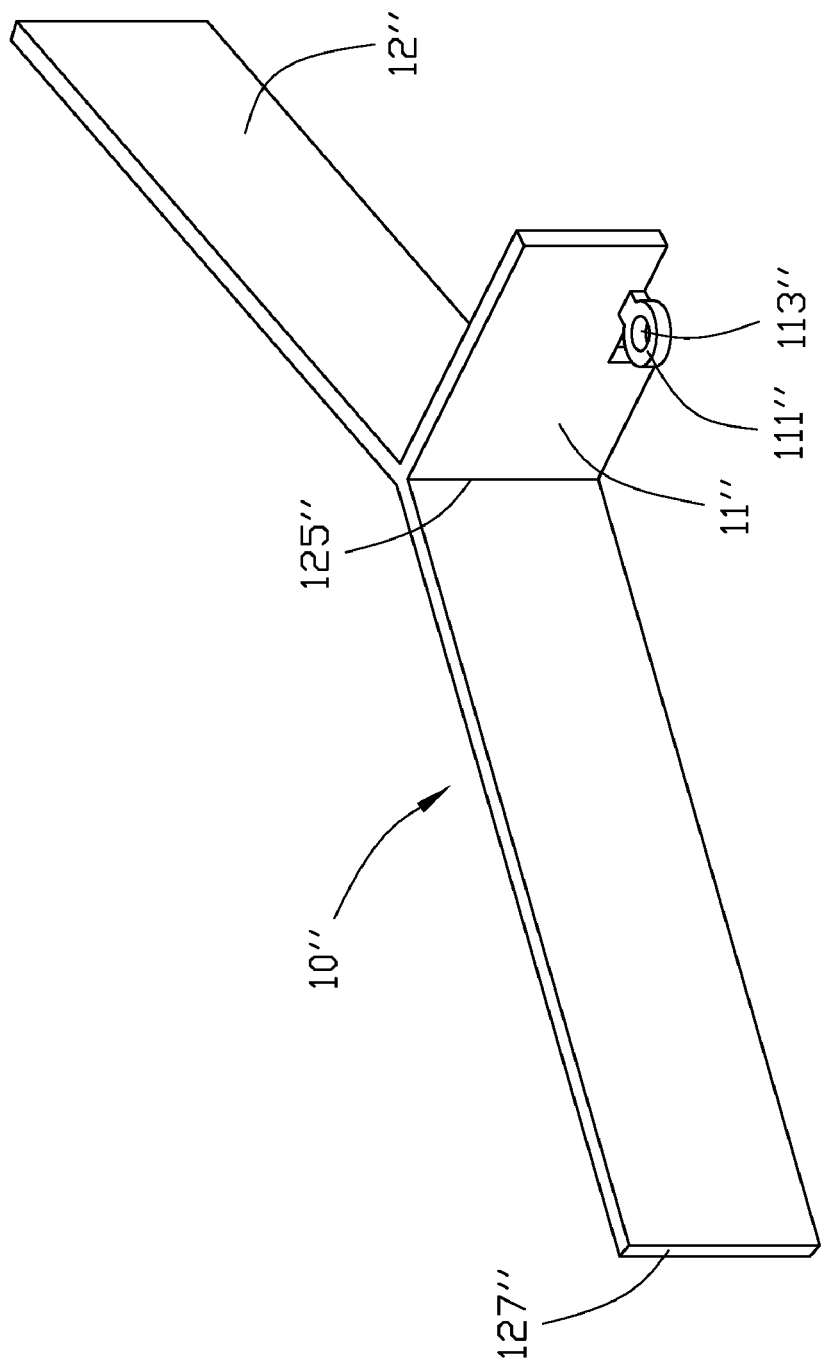
FIG. 4 is a schematic view of an air guiding element of an electronic apparatus of a third embodiment of the present invention.

Referring to FIG. 4, an air guiding element 10" of an electronic apparatus of a third embodiment of the present invention, includes a resisting panel 11" and two guiding panels 12" extending from the resisting panel 11" symmetrically and respectively towards the output openings 213 of the fan modules 20. A securing tab 111" extends from one side of the resisting panel 11" which defines a securing hole 113". The resisting panel 11" defines a cutout therein for matching with the circuit board 40. The guiding panel 12" defines a connecting end 125" connecting the resisting panel 11" and a free end 127". A plane defined by the free end 127" and the connecting end 125" of the guiding panel 12" is aligned at an angle larger than 90 degrees relative to the resisting panel 11".

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic apparatus, comprising:
    an enclosure;
    a circuit board mounted in the enclosure, the circuit board having at least one heat generating component thereon;
    a fan module having a fan and a first output opening corresponding to the fan; and
    an air guiding element mounted in the enclosure, wherein the air guiding element comprises a resisting panel and a guiding panel, the guiding panel comprises a guiding panel free end that extends toward the output opening of the fan module, the guiding panel free end guides airflow from the first output opening of the fan module to a first side of the resisting panel, and the resisting panel guides the airflow to the at least one heat generating component;
    wherein a plane defined by the ends of the guiding panel is aligned at an angle larger than 90 degrees relative to the resisting panel; and the electronic apparatus comprises a second fan module having a second fan and a second output opening opposite to the first output opening, the air guiding element comprises a second guiding panel extending toward the output opening of the second fan module, and the second guiding panel guides the airflow from the second output opening to a second side of the resisting panel opposite to the first side of the resisting panel.

2. The electronic apparatus as described in claim 1, wherein the guiding panel is arc-shaped.

3. The electronic apparatus as described in claim 1, wherein the guiding panel comprises a first bending portion connected the resisting panel and a second bending portion extending from the first bending portion.

4. The electronic apparatus as described in claim 1, wherein an line can be drawn from at least a portion of the first and second output opening to the heat generating component; wherein the line is unobstructed by the air guiding element.

5. The electronic apparatus as described in claim 1, wherein the air guiding element comprises a securing tab extending from one side of the resisting panel for securing the air guiding element in the enclosure.

6. The electronic apparatus as described in claim 5, wherein the securing tab defines a securing hole therein, and the circuit board defines a corresponding screw hole.

7. The electronic apparatus as described in claim 1, wherein the at least one heat generating component comprises a plurality of connectors for connecting outer devices.

8. The electronic apparatus as described in claim 1, wherein an line can be drawn from at least a portion of the output opening to the heat generating component; wherein the line is unobstructed by the air guiding element.

9. An electronic apparatus, comprising:
    an enclosure;
    a circuit board mounted in the enclosure, the circuit board having a plurality of heat generating components thereon;
    a fan module having a fan and a first output opening corresponding to the fan; and
    an air guiding element mounted in the enclosure, wherein the air guiding element comprises a resisting panel and a guiding panel extending toward the output opening of the fan module, the guiding panel guides airflow from the first output opening to a first side of the resisting panel, and the resisting panel guides the airflow to the heat generating components, the guiding panel defining a guiding panel free end and a connecting end that is connected to the resisting panel, a plane defined by the ends of the guiding panel is aligned at an angle larger than 90 degrees relative to the resisting panel;
    wherein the plurality of heat generating elements are disposed on both sides of the air guiding element and a resisting panel free end of the resisting panel is a predetermined distance from the plurality of heat generating components, and the air guiding element is capable of allowing air flow to the plurality of heat generating components disposed on two opposite sides of the resisting panel;
    wherein the electronic apparatus further comprises a second fan module having a second fan and a second output corresponding to the second fan of the second fan module, the air guiding element comprising a second guiding panel extending toward the output opening of the second fan module and guiding airflow from the second output opening to a second side of the resisting panel opposite to the first side of the resisting panel.

10. The electronic apparatus as described in claim 9, wherein the guiding panel of the air guiding element is arc-shaped.

11. The electronic apparatus as described in claim 9, wherein the guiding panel comprises a first bending portion connecting the resisting panel and a second bending portion extending from the first bending portion.

12. The electronic apparatus as described in claim 9, wherein an line can be drawn from at least a portion of the first and second output openings to all of the plurality of heat generating components; wherein the lines are unobstructed by the air guiding element.

13. The electronic apparatus as described in claim 9, wherein the air guiding element comprises a securing tab extending from one side of the resisting panel for securing the air guiding element in the enclosure.

14. The electronic apparatus as described in claim 13, wherein the securing tab defines a securing hole therein, and the circuit board defines a corresponding screw hole.

15. The electronic apparatus as described in claim 9, wherein each line segment is equal to that of one of the adjacent line segments.

16. The electronic apparatus as described in claim 9, wherein an line can be drawn from at least a portion of the output opening to all of the plurality of heat generating components, and the line is unobstructed by the air guiding element.

* * * * *